US012328103B2

United States Patent
Mayer et al.

(10) Patent No.: US 12,328,103 B2
(45) Date of Patent: Jun. 10, 2025

(54) LOCAL OSCILLATOR CLOCK SHAPING FOR PRE-DISTORTION

(71) Applicant: Analog Devices, Inc., Wilmington, MA (US)

(72) Inventors: Christopher Mayer, Dover, MA (US); Tao Yu, Needham Heights, MA (US); Gregory Patrick Davis, San Jose, CA (US)

(73) Assignee: Analog Devices, Inc., Wilmington, MA (US)

( * ) Notice: Subject to any disclaimer, the term of this patent is extended or adjusted under 35 U.S.C. 154(b) by 76 days.

(21) Appl. No.: 18/262,553

(22) PCT Filed: Feb. 22, 2022

(86) PCT No.: PCT/US2022/070763
§ 371 (c)(1),
(2) Date: Jul. 21, 2023

(87) PCT Pub. No.: WO2022/183177
PCT Pub. Date: Sep. 1, 2022

(65) Prior Publication Data
US 2024/0297622 A1 Sep. 5, 2024

Related U.S. Application Data

(60) Provisional application No. 63/200,266, filed on Feb. 25, 2021.

(51) Int. Cl.
*H03F 1/32* (2006.01)
*H03F 3/189* (2006.01)
*H03F 3/24* (2006.01)

(52) U.S. Cl.
CPC .......... *H03F 1/3247* (2013.01); *H03F 3/189* (2013.01); *H03F 3/24* (2013.01)

(58) Field of Classification Search
CPC ........ H03F 1/32; H03F 1/3241; H03F 1/3247; H03F 3/189; H03F 3/20; H03F 3/24; (Continued)

(56) References Cited

U.S. PATENT DOCUMENTS 6,621,340 B1 * 9/2003 Perthold ............... H03F 1/3241
330/136
6,819,720 B1 11/2004 Willetts
(Continued)

FOREIGN PATENT DOCUMENTS

JP 2008022513 A 1/2008

OTHER PUBLICATIONS

International Search Report and Written Opinion for International Application No. PCT/US2022/070763, dated Jun. 2, 2022 in 11 pages.

*Primary Examiner* — Young T. Tse
(74) *Attorney, Agent, or Firm* — Knobbe, Martens, Olson & Bear, LLP

(57) ABSTRACT

Apparatus and methods for pre-distorting a radio frequency transmit signal based on local oscillator clock shaping are disclosed. In certain embodiments, one or more clock signals generated by a local oscillator and used for mixing in a transceiver are shaped to account for non-linearity of a power amplifier that amplifies the radio frequency transmit signal. Such pre-distortion can be performed in addition to or alternatively to performing digital pre-distortion on a digital representation of the radio frequency transmit signal.

20 Claims, 11 Drawing Sheets

(58) Field of Classification Search
CPC ... H03F 2200/451; H04B 1/0475; H04B 1/38; H04B 1/40; H04B 2002/0408; H04B 2002/0425; H04L 27/367; H04L 27/368
USPC ........ 375/219, 279–281, 295–297, 306, 308; 332/103; 455/67.13, 69, 73, 86, 114.3
See application file for complete search history.

(56) References Cited

U.S. PATENT DOCUMENTS

| | | |
|---|---|---|
| 6,980,604 B2 | 12/2005 | Kubo et al. |
| 7,058,369 B1 | 6/2006 | Wright et al. |
| 7,515,651 B1 | 4/2009 | Haddadin et al. |
| 7,773,692 B2 | 8/2010 | Copeland et al. |
| 8,195,103 B2 | 6/2012 | Waheed et al. |
| 8,391,377 B2 | 3/2013 | Zhu et al. |
| 8,588,332 B2 | 11/2013 | Cai et al. |
| 8,630,211 B2 | 1/2014 | Gainey et al. |
| 8,737,526 B2 | 5/2014 | Coan et al. |
| 8,750,410 B2 | 6/2014 | Gandhi et al. |
| 8,918,069 B2 | 12/2014 | Shen et al. |
| 9,020,011 B1 | 4/2015 | Hiebert et al. |
| 9,210,009 B2 | 12/2015 | Pashay-Kojouri et al. |
| 9,379,742 B2 | 6/2016 | Wang et al. |
| 9,595,924 B2 | 3/2017 | Au et al. |
| 9,614,557 B1 | 4/2017 | Mayer et al. |
| 9,673,847 B1 | 6/2017 | Mayer et al. |
| 10,038,455 B2 | 7/2018 | Dartois |
| 2004/0142667 A1 | 7/2004 | Lochhead et al. |
| 2004/0208259 A1* | 10/2004 | Hunton ................ H04L 27/368 375/296 |
| 2007/0190952 A1* | 8/2007 | Waheed ................ H03F 1/3241 455/114.3 |
| 2008/0265996 A1* | 10/2008 | Kim ........................ H03F 3/20 330/291 |
| 2009/0227214 A1* | 9/2009 | Georgantas ............. H04B 1/30 455/86 |
| 2014/0266464 A1* | 9/2014 | Ma ........................ H03F 3/211 330/124 R |
| 2015/0139358 A1 | 5/2015 | Asuri et al. |
| 2015/0280755 A1 | 10/2015 | Jiang et al. |
| 2017/0149457 A1* | 5/2017 | Mayer .................. H04L 1/0042 |
| 2021/0083697 A1* | 3/2021 | Venkatraman ........... H04B 1/04 |

\* cited by examiner

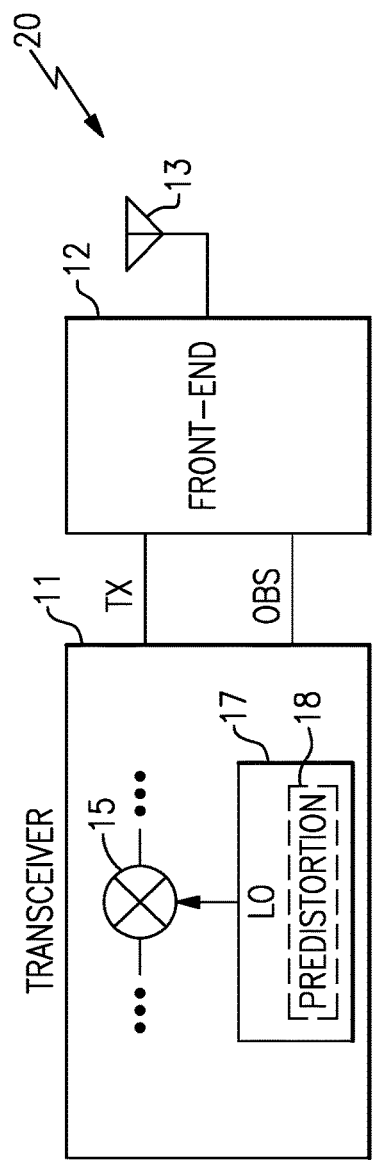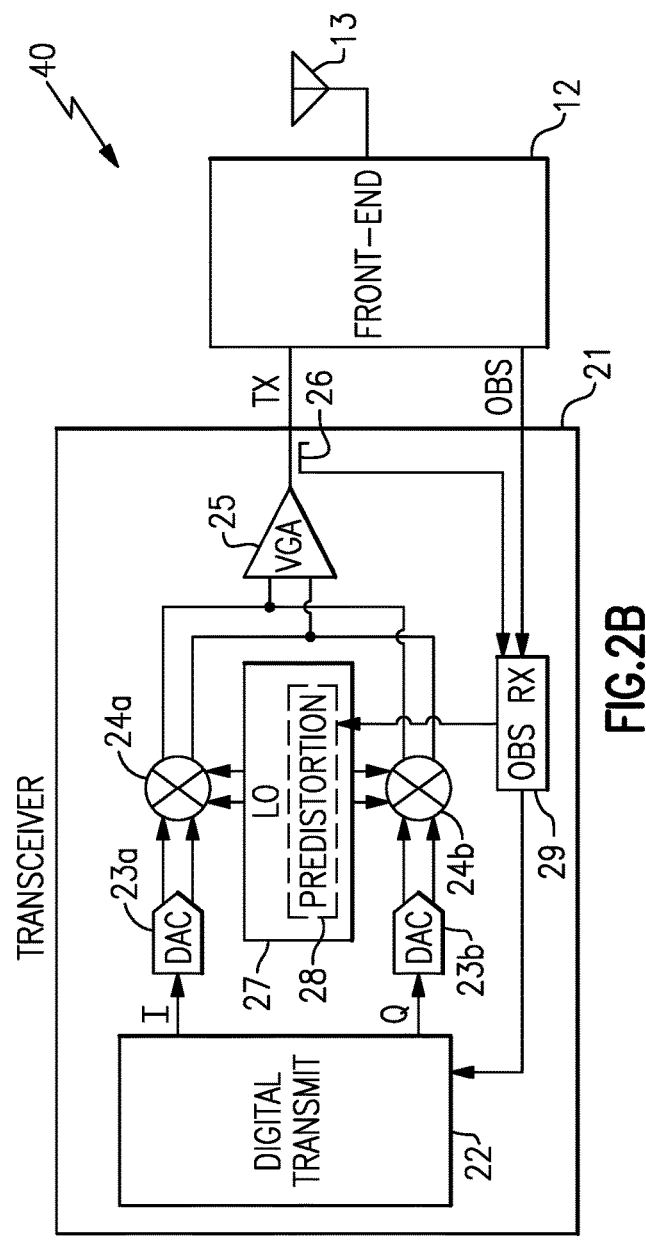
FIG.2A
FIG.2B

LOCAL OSCILLATOR CLOCK SHAPING FOR PRE-DISTORTION

FIELD OF THE DISCLOSURE

Embodiments of the invention relate to electronic systems, and more particularly, to transceivers for radio frequency electronics.

BACKGROUND

A radio transceiver can be used in a wide variety of radio frequency (RF) communication systems. For example, transceivers can be included in base stations or user equipment (for instance, mobile devices) to transmit and receive signals associated with a wide variety of communications standards, including, for example, cellular and/or wireless local area network (WLAN) standards. Transceivers can also be used in radar systems, instrumentation, industrial electronics, military electronics, laptop computers, digital radios, and/or other electronics.

SUMMARY OF THE DISCLOSURE

Apparatus and methods for pre-distorting a radio frequency transmit signal based on local oscillator clock shaping are disclosed. In certain embodiments, one or more clock signals generated by a local oscillator and used for mixing in a transceiver are shaped to account for non-linearity of a power amplifier that amplifies the radio frequency transmit signal. Such pre-distortion can be performed in addition to or alternatively to performing digital pre-distortion on a digital representation of the radio frequency transmit signal.

In one aspect, a radio frequency communication system includes a power amplifier configured to amplify a radio frequency transmit signal, and a transceiver configured to output the radio frequency transmit signal. The transceiver includes at least one mixer configured to generate the radio frequency transmit signal based on providing frequency upconversion to at least one baseband transmit signal, and a local oscillator configured to pre-distort the radio frequency transmit signal to compensate for a non-linearity of the power amplifier by providing one or more shaped clock signals to the at least one mixer.

In another aspect, a transceiver includes a digital transmit circuit configured to generate at least one baseband transmit signal, at least one mixer configured to generate a radio frequency transmit signal based on providing frequency upconversion to the at least one baseband transmit signal, and a local oscillator configured to pre-distort the radio frequency transmit signal by providing one or more shaped clock signals to the at least one mixer.

In another aspect, a method of pre-distortion in a transceiver is provided. The method includes generating at least one baseband transmit signal using a digital transmit circuit, generating a radio frequency transmit signal based on mixing the at least one baseband transmit signal using at least one mixer, and pre-distorting the radio frequency transmit signal by providing one or more shaped clock signals from a local oscillator to the at least one mixer.

BRIEF DESCRIPTION OF THE DRAWINGS

FIG. 2A is a schematic diagram of an RF communication system with local oscillator pre-distortion according to one embodiment.

FIG. 2B is a schematic diagram of an RF communication system with local oscillator pre-distortion according to another embodiment.

DETAILED DESCRIPTION OF EMBODIMENTS

Figure 1A:
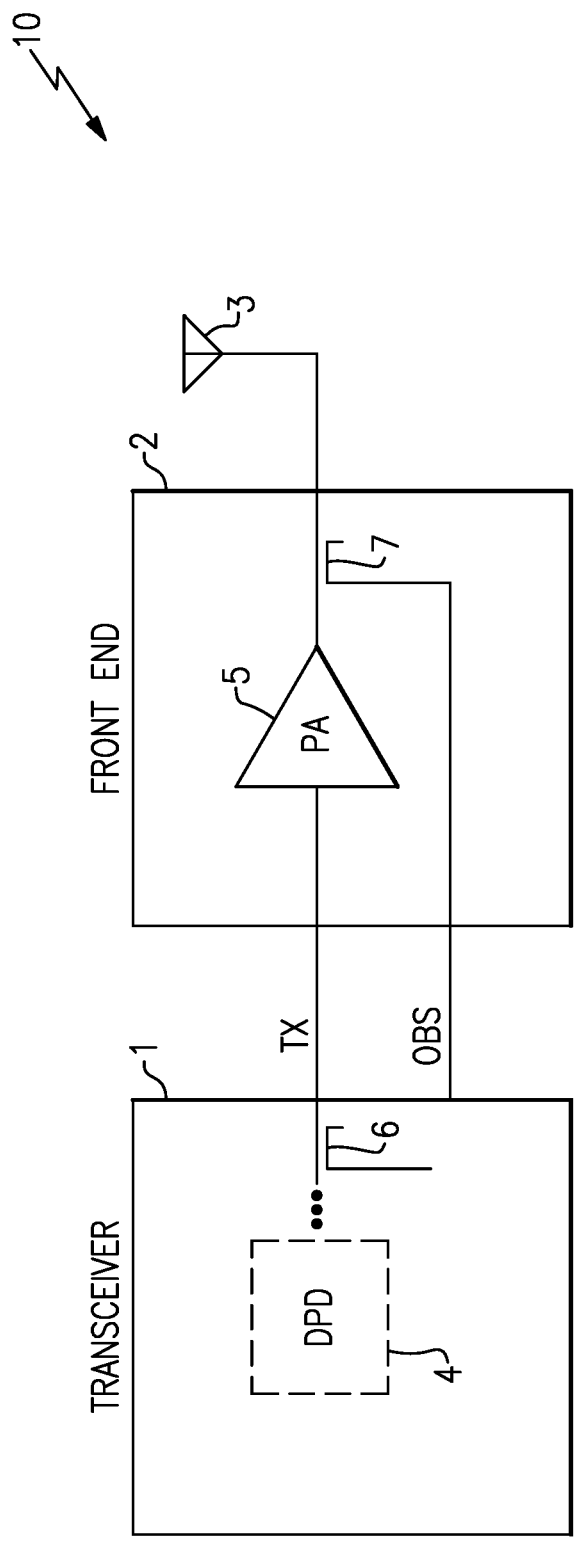
FIG. 1A is a schematic diagram of one example of an RF communication system.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Typical digital pre-distortion (DPD) systems operate by manipulating the baseband representation of a communications signal. For example, digital compensation can be applied to the in-phase (I) and quadrature-phase (Q) components of a baseband signal using look-up tables (LUTs) and/or multipliers to create a pre-distorted signal at baseband. When the pre-distorted signal is upconverted to radio frequency (RF), the added pre-distortion component allows a downstream power amplifier to output an RF waveform closer to the intended linear upconversion of the original baseband signal.

FIG. 1A is a schematic diagram of one example of an RF communication system 10. The RF communication system 10 includes a transceiver 1, a front end system 2, and an antenna 3. The transceiver 1 includes a DPD circuit 4 and an input power sensing directional coupler 6, while the front end system 2 includes a power amplifier 5, and an output power sensing directional coupler 7.

For clarity of the figure, only certain components of the transceiver 1 and the front end system 2 are depicted. However, the transceiver 1 and the front end system 2 can include additional components. Moreover, other configurations of input power detection and output power detection are possible, including, but not limited to, configurations in which input power detection is performed on the front end system 2 rather than in the transceiver 1.

As shown in FIG. 1A, the transceiver 1 provides an RF transmit signal TX to the front end system 2. Additionally, the RF transmit signal TX is amplified by the power amplifier 5 to generate an amplified transmit signal for the antenna 3.

In this example, the input power sensing directional coupler 6 provides local observation of the power amplifier's input power. Additionally, the output power sensing directional coupler 7 is used to generate an observation signal OBS indicating the power amplifier's output power. Thus, the transceiver 1 operates with observation data indicating the power amplifier's input power and the power amplifier's output power. Although one example of observation circuitry for input power and output power is depicted, observation can be performed in other ways.

The transceiver 1 generates the RF transmit signal TX with pre-distortion provided by the DPD circuit 4.

Figure 1B:
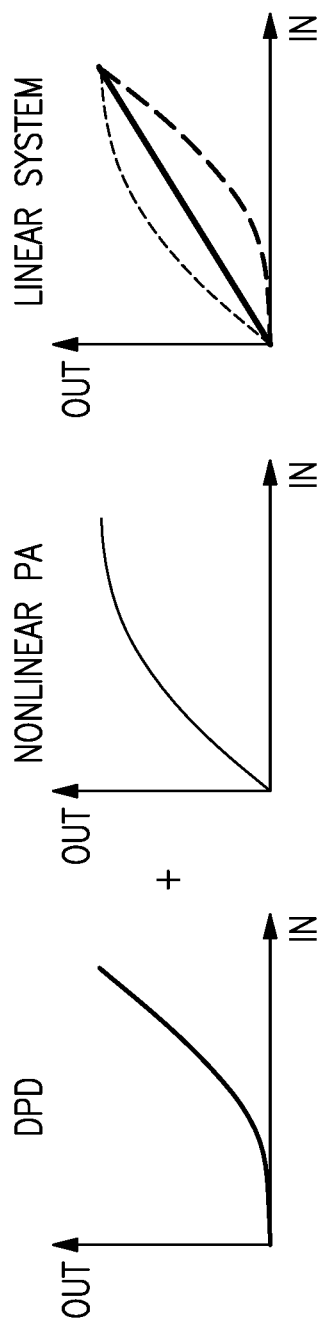
FIG. 1B is a set of graphs depicting one example of power amplifier linearization using digital pre-distortion (DPD).

FIG. 1B is a set of graphs depicting one example of power amplifier linearization using DPD. The graphs include a first graph (at left) of output signal (OUT) versus input signal (IN) for the DPD circuit 4 of FIG. 1A. The graphs further include a second graph (at middle) of output signal versus input signal for the power amplifier 5 of FIG. 1A. The graphs further include a third graph (at right) of output signal versus signal for the combination of the DPD circuit 4 and the power amplifier 5 of FIG. 1A.

As shown in FIG. 1B, DPD operates to provide pre-emphasis that compensates for power amplifier non-linearity. For example, DPD can be performed on the complex envelope at baseband to provide a curve fit to an inverse model of the power amplifier. For instance, in one example a sum of polynomials can be fitted to the desired envelope shape that compensates for power amplifier non-linearity.

Figure 1C:
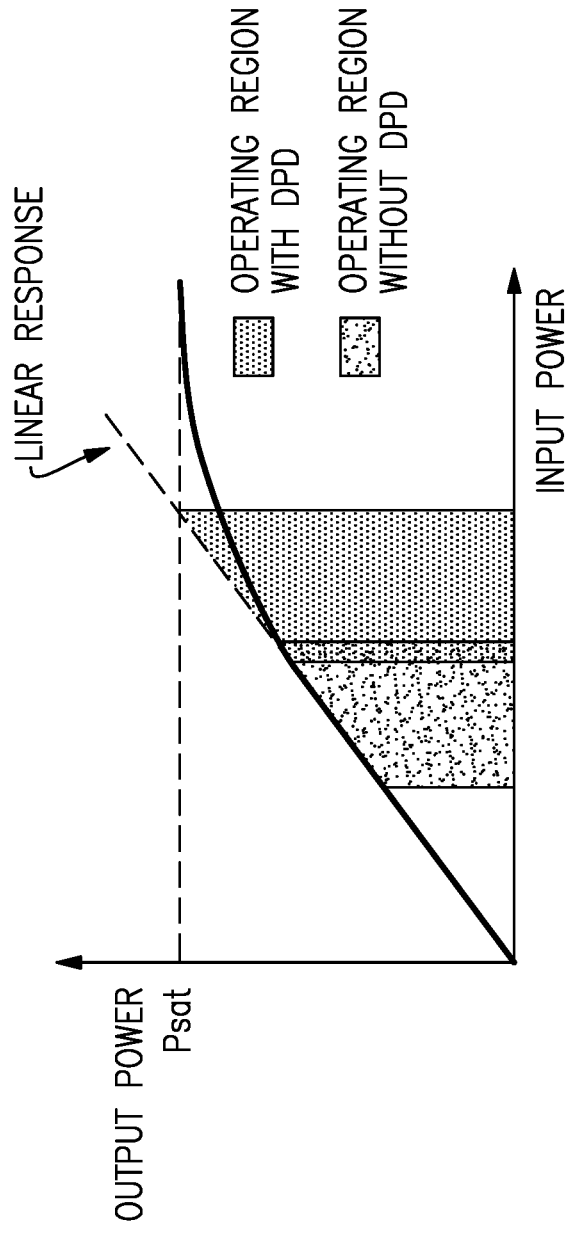
FIG. 1C is a graph of one example of output power versus input power for a power amplifier.

FIG. 1C is a graph of one example of output power versus input power for a power amplifier. The graph represents example performance of the power amplifier 5 of FIG. 1A with and without DPD. The graph is annotated with an ideal linear response as well as a saturated output power level (Psat).

As shown in FIG. 1C, the power amplifier 5 can operate at higher input power without gain compression when using DPD.

FIG. 2A is a schematic diagram of an RF communication system 20 with local oscillator pre-distortion according to one embodiment. The RF communication system 20 includes a transceiver 11, a front-end system 12, and an antenna 13.

As shown in FIG. 2A, the transceiver 11 provides an RF transmit signal TX to the front-end system 12, and receives an observation signal OBS from the front-end system 12. Although not shown in FIG. 2A, additional signals can be communicated between the transceiver 11 and the front-end system 12, such as receive signals, control signals, additional transmit signals, and/or additional observation signals.

In the illustrated embodiment, the transceiver 11 includes a mixer 15 and a local oscillator (LO) 17. The LO 17 includes a pre-distortion circuit 18 for pre-distorting at least one clock signal provided to the mixer 15.

The mixer 15 serves to provide frequency upconversion to a transmit signal, which can be analog or digital. After upconversion, the transmit signal can be further processed (for instance, amplified, filtered, converted, and/or otherwise processed) to generate the RF transmit signal TX.

In the illustrated embodiment, the clock signal(s) generated by the LO 17 are shaped to account for power amplifier non-linearity. Such pre-distortion can be performed in addition to or alternatively to performing DPD on a digital representation of the RF transmit signal TX.

The present disclosure recognizes that it is possible to pre-distort the local oscillator generation function such that the resulting mixed waveform at the output of the mixer 15 more closely resembles the inverse of the power amplifier drive capability.

Providing pre-distortion can provide a number of advantages, such as producing asymmetric outputs that more closely represent the drive transistor transfer function of the power amplifier separately from the matching network transfer function of the power amplifier. For example, typical power amplifier architectures (for example, common source, common emitter, cascode, and/or Doherty) use only one type of transistor to drive the output (for instance. an n-type transistor that only pulls down) instead of a complimentary structure of driving transistors.

As a practical result, power amplifiers typically rely on a passive resonant structure (for instance, a matching network) to recover the signal in the opposite direction. Such structures work well when tuned around narrow frequency bands (exhibiting a high quality factor (high-Q), which allows high efficiency with minimal distortion). However, as communication signals become wider in bandwidth, the matching network cannot be tuned for all frequencies, and significant distortion can be introduced. Thus, the transfer function of the drive transistor can behave very differently from the matching network's transfer function.

Using pre-distortion in the local oscillator 17 aids in compensating for power amplifier non-linearity including, but not limited to, non-linear behavior arising from a mismatch in the drive transistor function and the matching network transfer function. Such effects cannot be corrected directly at baseband, because the signal has not yet been upconverted to RF frequency. Moreover, using clock shaping allows threshold modifications to be introduced easily to compensate for transistor device threshold changes directly, such as those arising in gallium nitride (GaN) applications.

In certain implementations, pre-distortion using local oscillator clock shaping is combined with DPD at baseband to provide enhanced performance relative to a transceiver using DPD at baseband alone.

FIG. 2B is a schematic diagram of an RF communication system 40 with local oscillator pre-distortion according to another embodiment. The RF communication system 40 includes a transceiver 21, a front-end system 12, and an antenna 13.

In the illustrated embodiment, the transceiver 21 includes a digital transmit circuit 22, an I-path digital-to-analog converter (DAC) 23a, a Q-path DAC 23b, an I-path mixer 24a, a Q-path mixer 24b, a variable gain amplifier (VGA) 25, a directional coupler 26, an LO 27, and an observation receiver 29. The LO 27 includes a pre-distortion circuit 28.

Although one example of a transceiver with clock pre-distortion is shown, the teachings herein are applicable to transceivers implemented in a wide variety of ways. Accordingly, other implementations are possible.

The digital transmit circuit 22 generates a pair of quadrature signals, corresponding to a digital I signal and a digital Q signal.

The I-path DAC 23a converts the digital I signal from the digital transmit circuit 22 into a differential analog I signal, in this example. The I-path mixer 24a receives an I clock signal from the LO 27, which the I-path mixer 24a uses to upconvert the differential analog I signal. The Q-path DAC 23b converts the digital Q signal from the digital transmit circuit 22 into a differential analog Q signal, in this example. The Q-path mixer 24b receives a Q clock signal from the LO 27, which the Q-path mixer 24b uses to upconvert the differential analog Q signal.

When quadrature error is not present, the analog I signal and the analog Q signal have a phase separation of 90 degrees, and serve as a complex representation of an RF transmit signal. The output of the I-path mixer 24a and the output of the Q-path mixer 24b are combined to generate a differential upconverted signal, which is amplified by the VGA 25 to generate the RF transmit signal TX.

The LO 27 includes the pre-distortion circuit 28 for pre-distorting the I clock signal and the Q clock signal that are provided to the I-path mixer 24a and the Q-path mixer 24b, respectively. The I clock signal and the Q clock signal are differential, in this example, As shown in FIG. 2B, the observation receiver 29 processes a local observation signal from the directional coupler 26 and the observation signal OBS from the front end system 12 to generate observation data that is provided to the LO 27. The observation data can be used to train the clock pre-distortion used by the LO 27. The observation data is also provided to the digital transmit circuit 22, which can use the observation data for a variety of functions, such as transmit power control and/or signal DPD.

In the illustrated embodiment, the I-path mixer 24a and the Q-path mixer 24b are analog mixers, which mix analog I and Q signals.

Figure 2C:
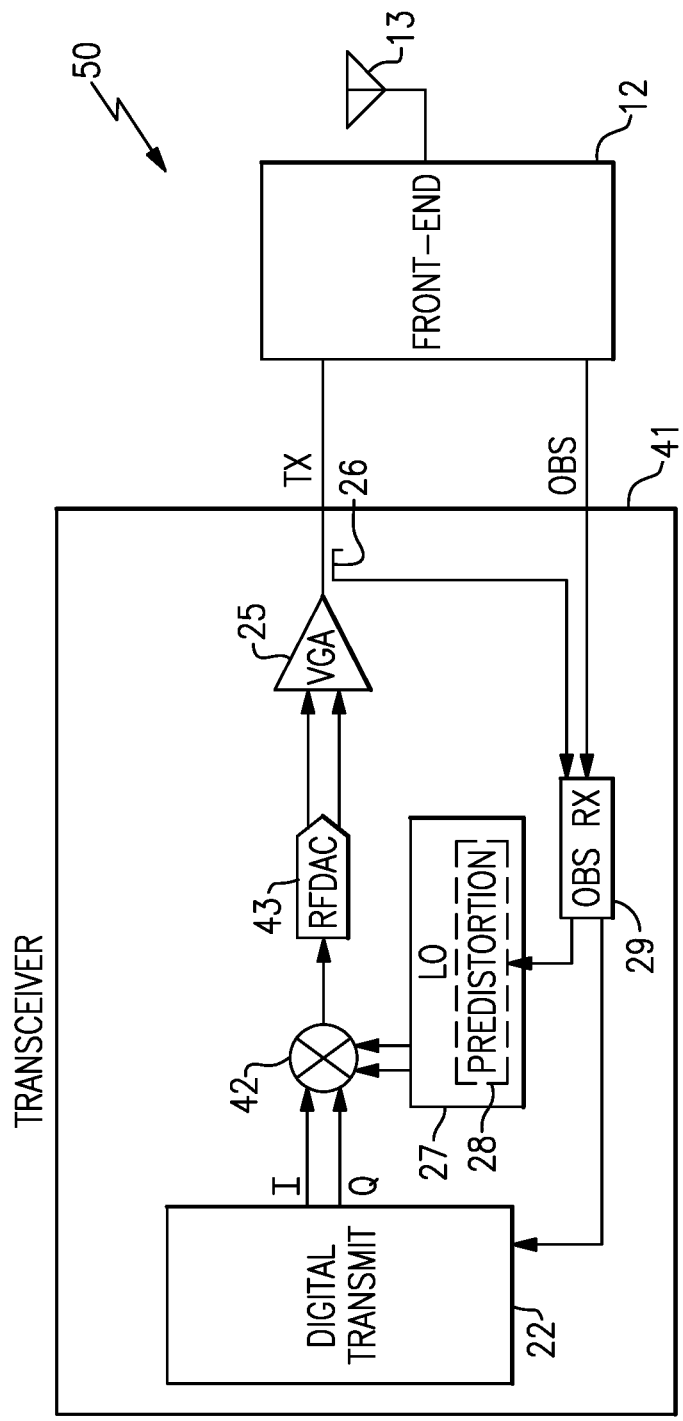
FIG. 2C is a schematic diagram of an RF communication system with local oscillator pre-distortion according to another embodiment.

FIG. 2C is a schematic diagram of an RF communication system 50 with local oscillator pre-distortion according to another embodiment. The RF communication system 50 includes a transceiver 41, a front-end system 12, and an antenna 13.

In the illustrated embodiment, the transceiver 41 includes a digital transmit circuit 22, a digital mixer 42, an RF DAC 43, a VGA 25, a directional coupler 26, an LO 27, and an observation receiver 29. The LO 27 includes a pre-distortion circuit 28.

In comparison to the to the RF communication system 40 of FIG. 2B, the RF communication system 50 of FIG. 2C is implemented to perform mixing prior to digital-to-analog conversion. Accordingly, in contrast to the RF communication system 40 of FIG. 2B that uses analog mixers, the RF communication system 50 of FIG. 2C uses the digital mixer 42.

The digital mixer 42 receives a digital I signal and a digital Q signal from the digital transmit circuit 22. Additionally, the digital mixer 52 receives an I clock signal and a Q clock signal from the LO 27. The I clock signal and the Q clock signal are pre-distorted by the pre-distortion circuit 28 to provide compensation for non-linearity of a downstream power amplifier. The digital mixer 52 outputs a digital representation of an upconverted transmit signal, which is processed by the RF ADC 43 to generate an analog upconverted transmit signal (which is differential, in this example). The analog upconverted transmit signal is amplified by the VGA 25 to generate the RF transmit signal TX.

In certain implementations, the digital mixer 42 operates to calculate ((I*LO_I)−(Q*LO_Q)), where I is the digital I signal, Q is the digital Q signal, LO_I is the I clock signal, and LO_Q is the Q clock signal.

Figure 2D:
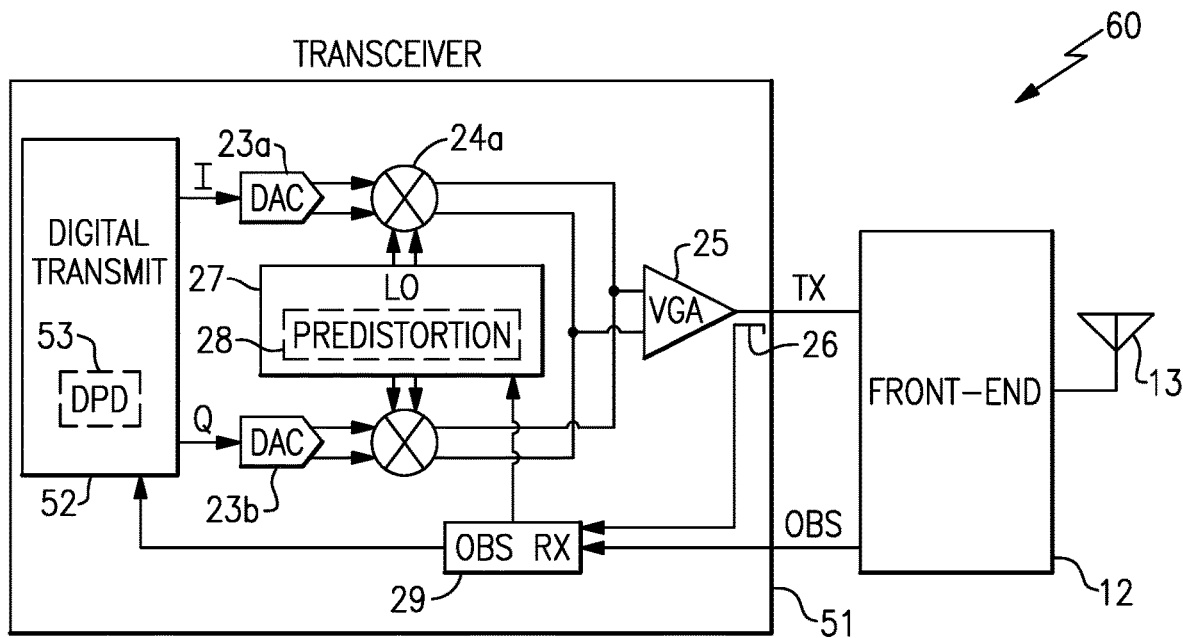
FIG. 2D is a schematic diagram of an RF communication system with local oscillator pre-distortion according to another embodiment.

FIG. 2D is a schematic diagram of an RF communication system 60 with local oscillator pre-distortion according to another embodiment. The RF communication system 60 includes a transceiver 51, a front-end system 12, and an antenna 13.

The RF communication system 60 of FIG. 2D is similar to the RF communication system 40 of FIG. 2B, except that the transceiver 51 of FIG. 2D includes a digital transmit circuit 52 that includes a DPD circuit 53. Thus, the combination of DPD on the baseband representation of the RF transmit signal TX and pre-distortion in the LO 27 is used to compensate for non-linearity in the front-end system 12. The DPD circuit 53 is trained by observation data from the observation receiver 29.

Using the combination of baseband signal DPD and LO clock pre-distortion provides enhanced compensation for power amplifier non-linearity.

Figure 2E:
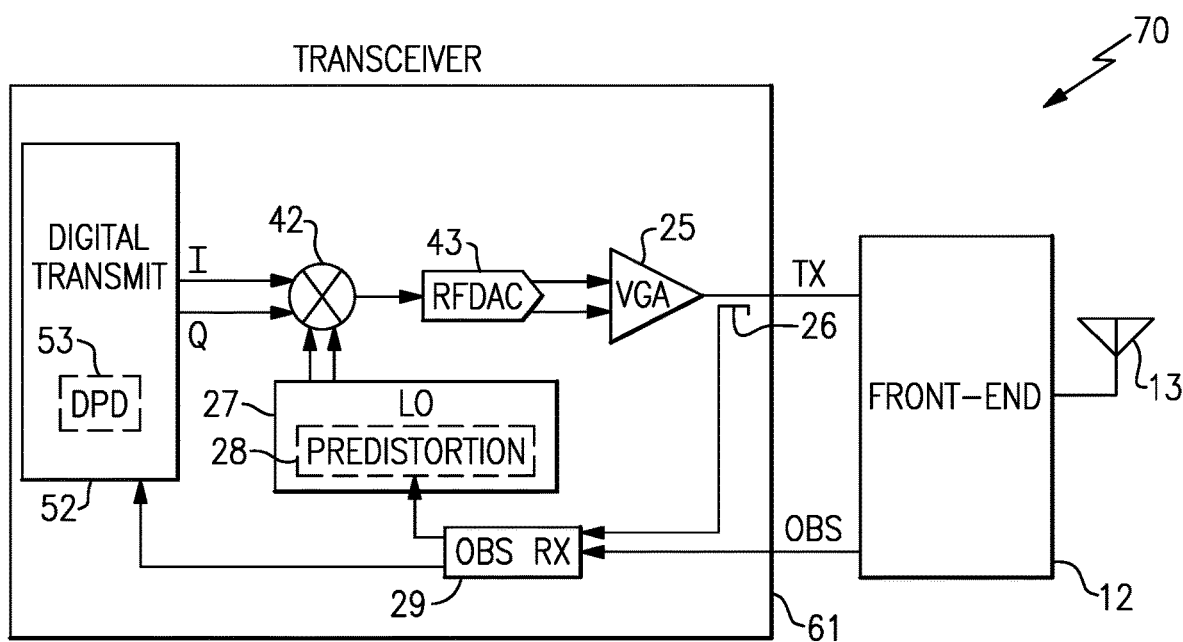
FIG. 2E is a schematic diagram of an RF communication system with local oscillator pre-distortion according to another embodiment.

FIG. 2E is a schematic diagram of an RF communication system 70 with local oscillator pre-distortion according to another embodiment. The RF communication system 70 includes a transceiver 61, a front-end system 12, and an antenna 13.

The RF communication system 70 of FIG. 2E is similar to the RF communication system 50 of FIG. 2C, except that the transceiver 61 of FIG. 2E includes a digital transmit circuit 52 that includes a DPD circuit 53. Thus, the combination of baseband signal DPD and clock pre-distortion is used to compensate for power amplifier non-linearity.

FIGS. 3A to 3D depict various embodiments of clock pre-distortion techniques implemented using pre-distorting numerically controlled oscillators (NCOs).

A pre-distorting NCO can produce asymmetric outputs that more closely represent the drive transistor transfer function separately from the matching network transfer function of a power amplifier. In addition, threshold modifications can be introduced easily to compensate for GaN device threshold changes directly.

Such an NCO operates with a programmable generation function that can be tuned to the power amplifier characteristics through the DPD feedback loop and adaptation process. Such a generation function can also contain state functions for real and/or virtual power amplifier characteristics, including, but not limited to, transfer functions versus temperature, transfer functions versus frequency, and/or power amplifier threshold.

The NCO, instead of generating a pure continuous wave (CW) waveform, can generate pre-distorted clock signals used for compensating for power amplifier non-linearity.

By using an NCO with pre-distortion, a similar baseband rate control system can be used as traditional DPD, but would allow efficient application of the correction at RF. Such correction can be particularly beneficial for correcting for asymmetric effects during the rise versus fall of the LO signal.

In the embodiments of FIG. 3A to 3D, an NCO is depicted as receiving a frequency control word $F_{CTL}$, and generating sinusoidal waveforms having a frequency that changes in relation to the frequency control word $F_{CTL}$. Such NCOs can include an accumulator for generating a phase signal based on accumulating the frequency control word $F_{CTL}$, and a phase-to-amplitude converter for generating the sinusoidal waveforms based on the phase signal. However, other implementations are possible.

For example, any of the LOs below can be implemented using an NCO accumulator that accumulates the frequency control word $F_{CTL}$ to generate a phase signal, and a look-up table (LUT) that generates the shaped LO clock signal waveforms based on the value of the phase signal. Accordingly, a LUT of an LO can be used to provide pre-distortion, in some embodiments.

Figure 3A:
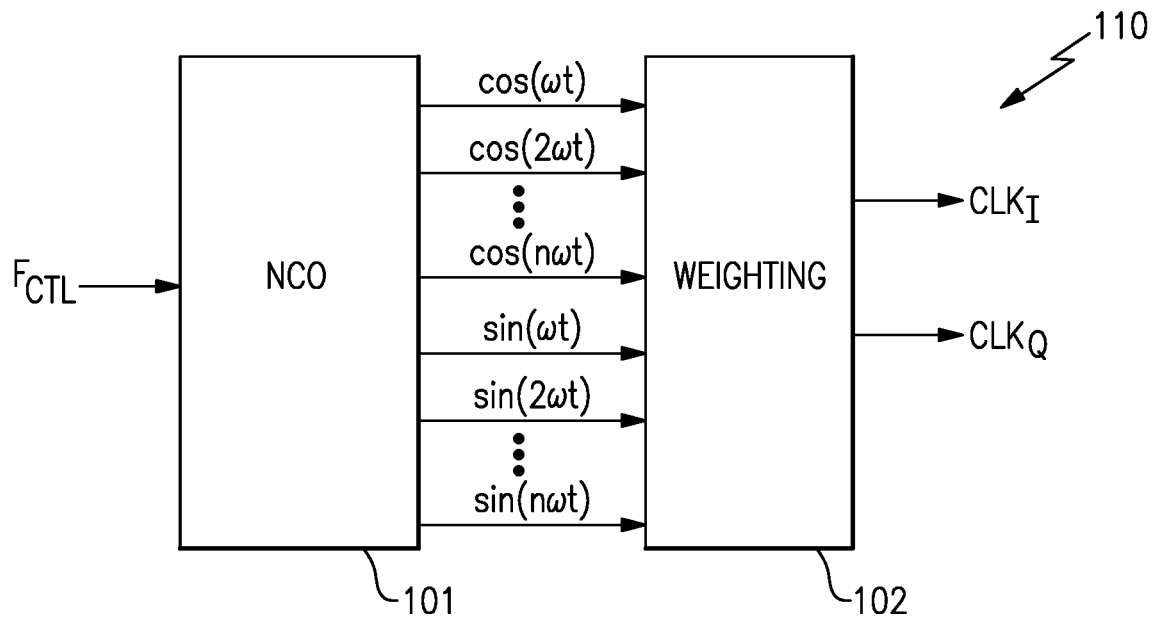
FIG. 3A is a schematic diagram of a local oscillator with pre-distortion according to one embodiment.

FIG. 3A is a schematic diagram of a local oscillator 110 with pre-distortion according to one embodiment. The local oscillator 110 is implemented as a pre-distorting NCO. The local oscillator 110 includes an NCO 101 that is digitally tuned using a frequency control word $F_{CTL}$, and a weighting circuit 102 for generating an I clock signal $CLK_I$ and a Q clock signal $CLK_Q$ each based on a weighted combination of two or more input clock signals provided by the NCO 101.

In the illustrated embodiment, the NCO 101 operates to output at least one clock signal of angular frequency ω (which changes based on $F_{CTL}$) and at least one harmonic of the clock signal. For example, in the illustrated embodiment, the NCO 101 outputs cos(ωt), cos(2ωt), . . . cos(nωt) and sin(ωt), sin(2ωt), . . . sin(nωt), where n is an integer greater than or equal to 2. However, other implementations are possible, such as implementations in which the NCO 101 outputs a phase signal that is provided to a LUT that provides weighting via the LUT's look-up function.

The I clock signal $CLK_I$ and the Q clock signal $CLK_Q$ are used by a mixer for upconverting a transmit signal, and can be weighted in a wide variety of ways. In one example, the LO 110 of FIG. 3A can be used to generate a periodic wave with harmonics added, as set forth below in Equation 1 and Equation 2.

$$LO'_I = \sum_{k=1}^{N} \alpha_k \cos(\omega_{LO} k t) \quad \text{Equation 1}$$

$$LO'_Q = \sum_{k=1}^{N} \alpha_k \sin(\omega_{LO} k t) \quad \text{Equation 2}$$

The equations above reflect harmonics to the Nth order added to the mixing waveform. The coefficients $\alpha_k$ would be determined by adaptation and change as the power amplifier characteristics or waveform characteristics vary over time. For example, the coefficients $\alpha_k$ can be adapted based on observation data from an observation receiver (for example, the observation receiver 29 of FIGS. 2A to 2E).

Figure 3B:
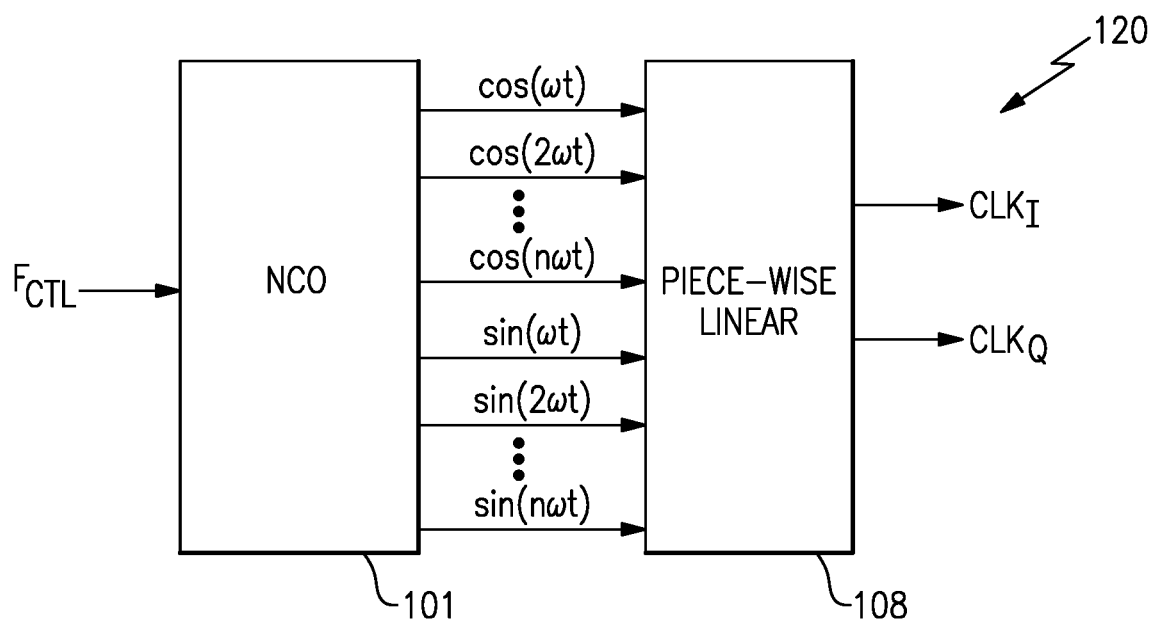
FIG. 3B is a schematic diagram of a local oscillator with pre-distortion according to another embodiment.

FIG. 3B is a schematic diagram of a local oscillator 120 with pre-distortion according to one embodiment. The local oscillator 120 is implemented as a pre-distorting NCO, and includes an NCO 101 and a piece-wise linear circuit 108. The NCO 101 operates to output at least one clock signal of angular frequency ω (which changes based on $F_{CTL}$) and at least one harmonic of the clock signal. For example, in the illustrated embodiment, the NCO 101 outputs cos(ωt), cos (2ωt), . . . cos(nωt) and sin(ωt), sin(2ωt), . . . sin(nωt), where n is an integer greater than or equal to 2.

In the illustrated embodiment, a piecewise linear model is used to model asymmetric drive capability in the power amplifier. For example, the piecewise linear circuit 108 can be implemented to allow distinct α and β coefficients for the drive regions, as set forth in Equation 3 and Equation 4 below.

$$LO'_I = \begin{cases} \sum_{k=1}^{N} \alpha_k \cos(\omega_{LO} k t), & frac(t) < 0.25 \text{ or } frac(t) \geq 0.75 \\ \sum_{k=1}^{N} \beta_k \cos(\omega_{LO} k t), & 0.25 \leq frac(t) < 0.75 \end{cases} \quad \text{Equation 3}$$

$$LO'_Q = \begin{cases} \sum_{k=1}^{N} \alpha_k \sin(\omega_{LO} k t), & 0 \leq frac(t) < 0.50 \\ \sum_{k=1}^{N} \beta_k \sin(\omega_{LO} k t), & 0.50 \leq frac(t) < 1.0 \end{cases} \quad \text{Equation 4}$$

In certain embodiments, PWL LO pre-distortion is applied to a transmit signal that is processed to remove phase information from the signal. Additionally, phase information is restored to the transmit signal by providing the phase information via the LO path. By separating the phase in this manner, PWL pre-distortion can be applied to an LO.

Figure 3C:
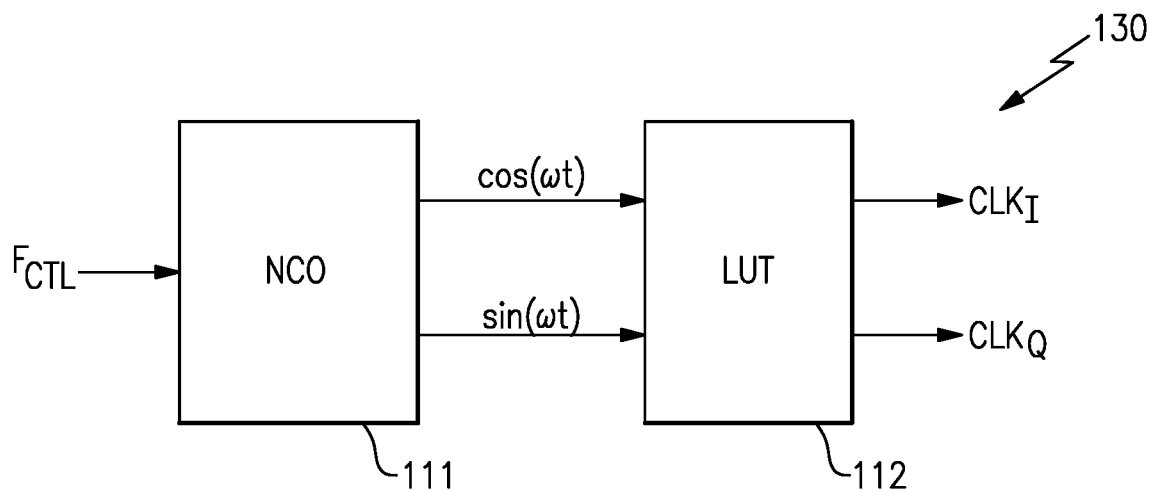
FIG. 3C is a schematic diagram of a local oscillator with pre-distortion according to another embodiment.

FIG. 3C is a schematic diagram of a local oscillator 125 with pre-distortion according to another embodiment. The local oscillator 125 includes an NCO 111 that outputs at least one clock signal (cos(ωt) and sin(ωt), in this example) having a frequency tuned by a digital control word $F_{CTL}$, and a look-up table (LUT) 112 for outputting an I clock signal $CLK_I$ and a Q clock signal $CLK_Q$ based on a phase of (portion of the cycle of) an input clock signal.

Thus, the LUT 112 is used to provide arbitrary replacement waveforms for $LO_I = \cos(\omega_{LO} t)$ and $LO_Q = \sin(\omega_{LO} t)$ expressions. The LUT 112 can be implemented in a variety of ways, for example, random access memory (RAM) or register based. In certain implementations, the LUT 112 is indexed (for instance, addressed) by the phase of the expression, frac(t). For example, rather than generating explicit sinusoid functions, an NCO can generate a phase signal that serves as the index of the LUT 112.

Figure 3D:
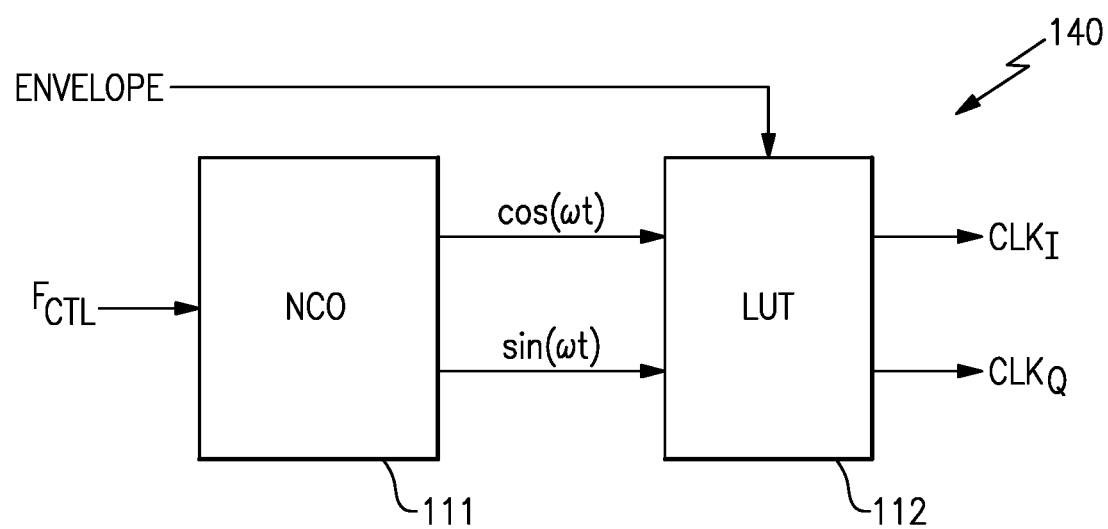
FIG. 3D is a schematic diagram of a local oscillator with pre-distortion according to another embodiment.

FIG. 3D is a schematic diagram of a local oscillator 130 with pre-distortion according to another embodiment. The local oscillator 130 of FIG. 3D is similar to the local oscillator 125 of FIG. 3C, except that in FIG. 3D the LUT 112 is also controlled based on an envelope signal ENV.

Thus, in the illustrated embodiment, the envelope signal ENV is used as a further input to the LUT 112. The envelope signal ENVELOPE indicates the signal envelope of the RF transmit signal transmitted by the transceiver.

Thus, the values of the clock signals generated by the pre-distorting NCO are a function of the signal envelope, in this embodiment. Implementing the pre-distorting NCO in this manner provides a further enhancement in accurately compensating for power amplifier non-linearity.

Figure 4A:
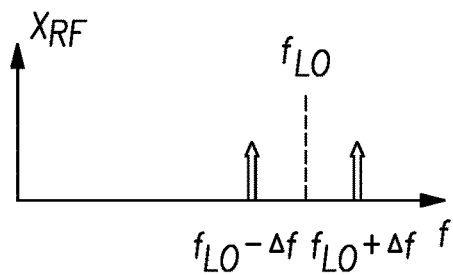
FIG. 4A is one example of a graph of signal magnitude versus frequency.

FIG. 4A is one example of a graph of signal magnitude versus frequency. The graph represents a two-tone test with wide tone separation 2Δω, where Δω=2πΔf.

In certain implementations, the RF signal amplitude $X_{RF}$(t) under the two-tone test is given by Equation 5 below.

$$x_{RF}(t) = \text{Re}\left\{\frac{1}{2}\left[e^{-j(\Delta\omega t - \phi_0)} + e^{j(\Delta\omega t + \phi_0)}\right]e^{j(\omega_{LO} t + \phi_{LO})}\right\} = \quad \text{Equation 5}$$
$$\cos\Delta\omega t \cos[\omega_{LO} t + \phi_{LO} + \phi_0]$$

As shown in Equation 5, the RF signal amplitude $X_{RF}$(t) has a phase based on both the LO's phase ($\varphi_{LO}$) and an initial signal phase ($\varphi_0$).

Figure 4B:
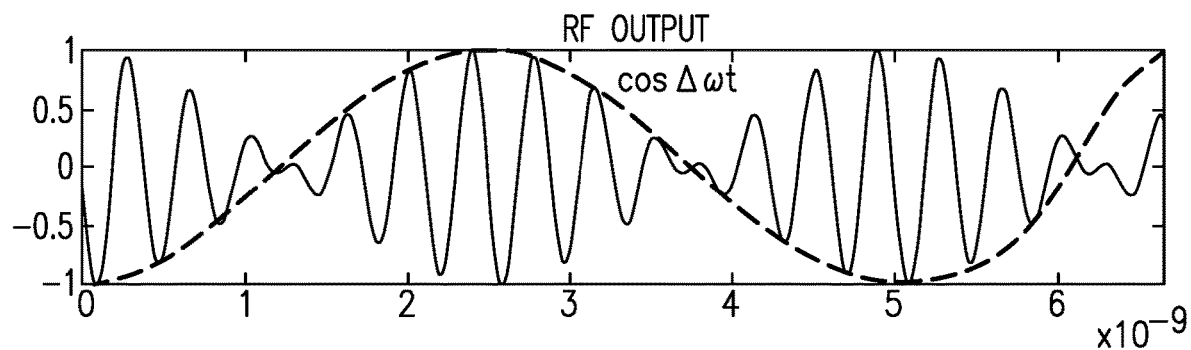
FIG. 4B is one example of a graph of RF output versus time.

FIG. 4B is one example of a graph of RF output versus time. The graph corresponds to an example RF signal under a two tone test (for instance, as shown in FIG. 4A).

As shown in FIG. 4B, RF signal amplitude is a function of LO phase.

Figure 4C:
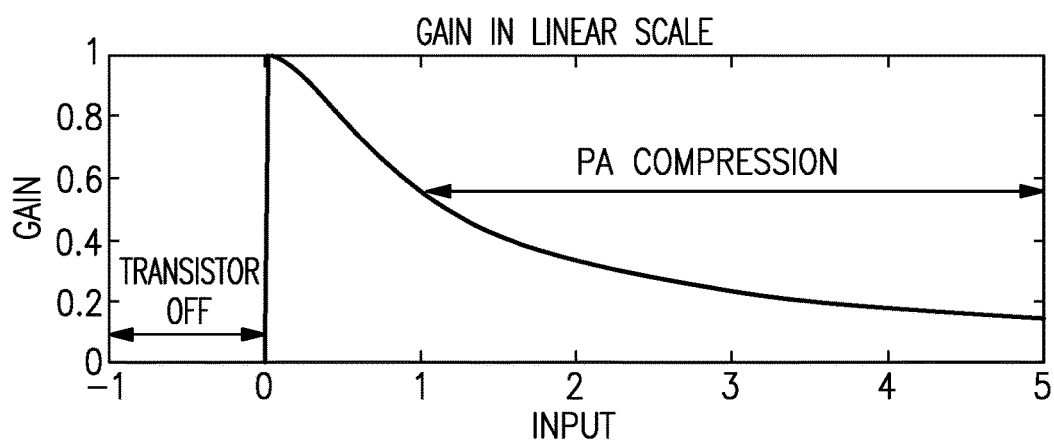
FIG. 4C is one example of a graph of power amplifier gain versus input power.

FIG. 4C is one example of a graph of power amplifier gain versus input power. The graph depicts example power amplifier non-linearity for a class B power amplifier.

Clipping and compression is on $X_{RF}(t)$ as shown. For the same baseband envelope (for instance, the dashed line in the example of FIG. 4B), the compression depends on $\phi_{LO}$ as well as the exact oscillation modulating the baseband envelope.

Accordingly, the resulting nonlinear terms after sampling have phase dependency with respect to $\phi_{LO}$, or, in other words, dependent on the total phase term $\phi_{LO}+\phi_0$.

Figure 5:
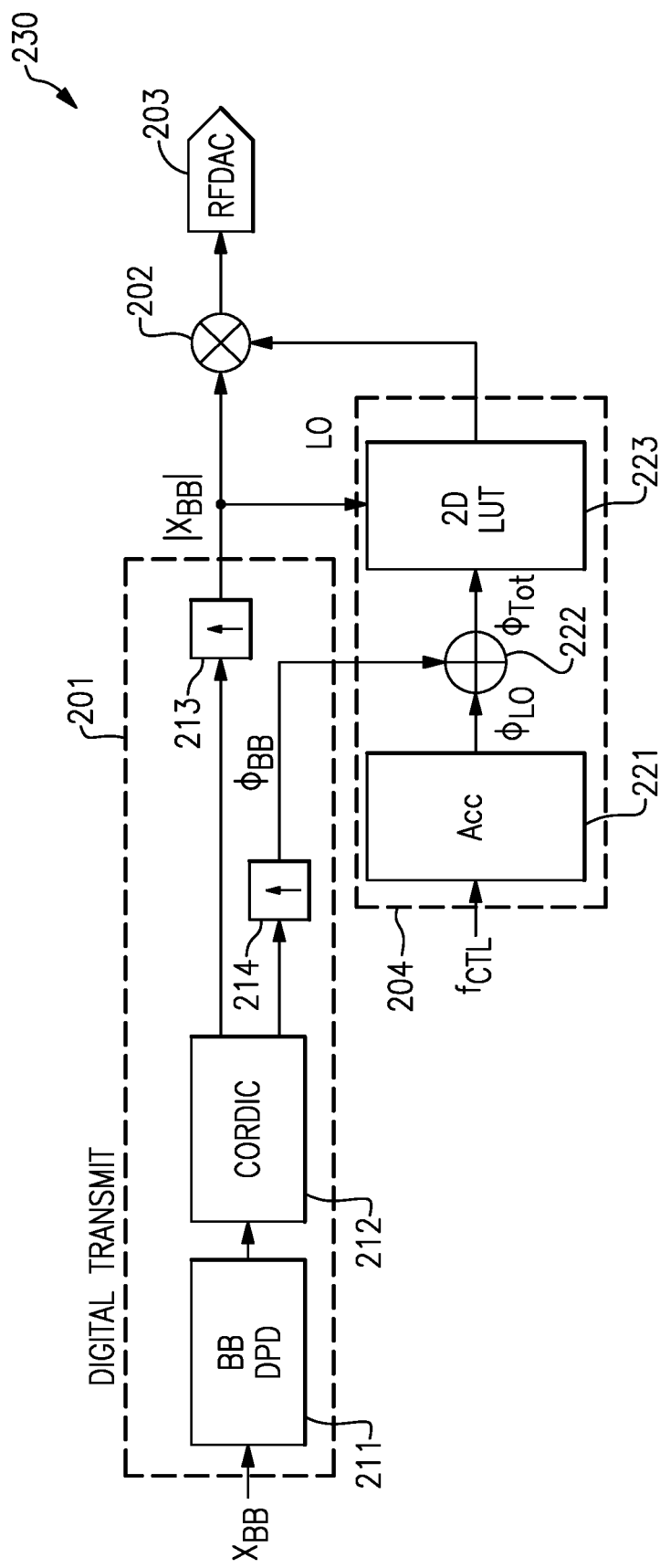
FIG. 5 is a schematic diagram of a transceiver with local oscillator pre-distortion according to another embodiment.

FIG. 5 is a schematic diagram of a transceiver 230 with local oscillator pre-distortion according to another embodiment. The transceiver 230 includes a digital transmit circuit 201, a digital mixer 202, an RF DAC 203, and an LO 204.

In the illustrated embodiment, the digital transmit circuit 201 includes a baseband DPD circuit 211, a coordinate rotation digital computer (CORDIC) circuit 212, an amplitude upsampler 213, and a phase upsampler 214. The baseband DPD circuit 211 receives a digital baseband signal $X_{BB}$, which the baseband DPD circuit 211 shapes to generate a digital shaped signal that is provided to the CORDIC circuit 212. The CORDIC circuit 212 processes the digital shaped signal to generate a digital transmit amplitude signal $|X_{BB}|$ and a digital transmit phase signal $\varphi_{BB}$. In certain implementations, the digital amplitude transmit signal $|X_{BB}|$ and a digital transmit phase signal $\varphi_{BB}$ are upsampled to a suitable rate.

With continuing reference to FIG. 5, after upsampling the digital transmit amplitude signal $|X_{BB}|$ is upconverted by the digital mixer 202 and subsequently processed by the RF DAC 203 to generate an RF transmit signal. Although an example with digital mixing is shown, the embodiment of FIG. 5 can be adapted to a configuration using analog mixing.

In the illustrated embodiment, the LO 204 includes an accumulator 221, and adder 222, and a two-dimensional LUT 223. The accumulator 221 accumulates the frequency control word $F_{CTL}$ to generate a digital LO phase signal $\varphi_{LO}$. The adder 222 adds the LO phase signal $\varphi_{LO}$ to the digital transmit phase signal $\varphi_{BB}$ to generate a total phase signal $\varphi_{Tot}$ that serves as a first input to the two-dimensional LUT 223. Additionally, the upsampled digital transmit amplitude signal $|X_{BB}|$ serves as a second input to the two-dimensional LUT 223.

As shown in FIG. 5, the two-dimensional LUT 223 generates one or more shaped LO clock signals used by the digital mixer 202 for frequency upconversion. Accordingly, LO pre-distortion is based on the total phase signal $\varphi_{Tot}$ and the digital transmit amplitude signal $|X_{BB}|$, in this embodiment.

By implementing the LO pre-distortion in this manner, nonlinear terms are accounted for with enhanced accuracy. In particular, certain non-linear terms are dependent on both signal phase and LO phase, and thus providing LO clock shaping based on the total phase can provide more effective pre-distortion.

Although FIG. 5 depicts an embodiment in which a two-dimensional LUT 223 is included for enhanced performance, in another embodiment the transceiver 230 is implemented with a single dimensional LUT that operates based on the total phase signal $\varphi_{TOT}$. Although implementing a LUT with an additional index of transmit amplitude can provide a performance enhancement by providing amplitude dependent corrections, pre-distortion can also be provided using a single dimensional LUT indexed based on a sum of signal phase and LO phase.

Figure 6A:
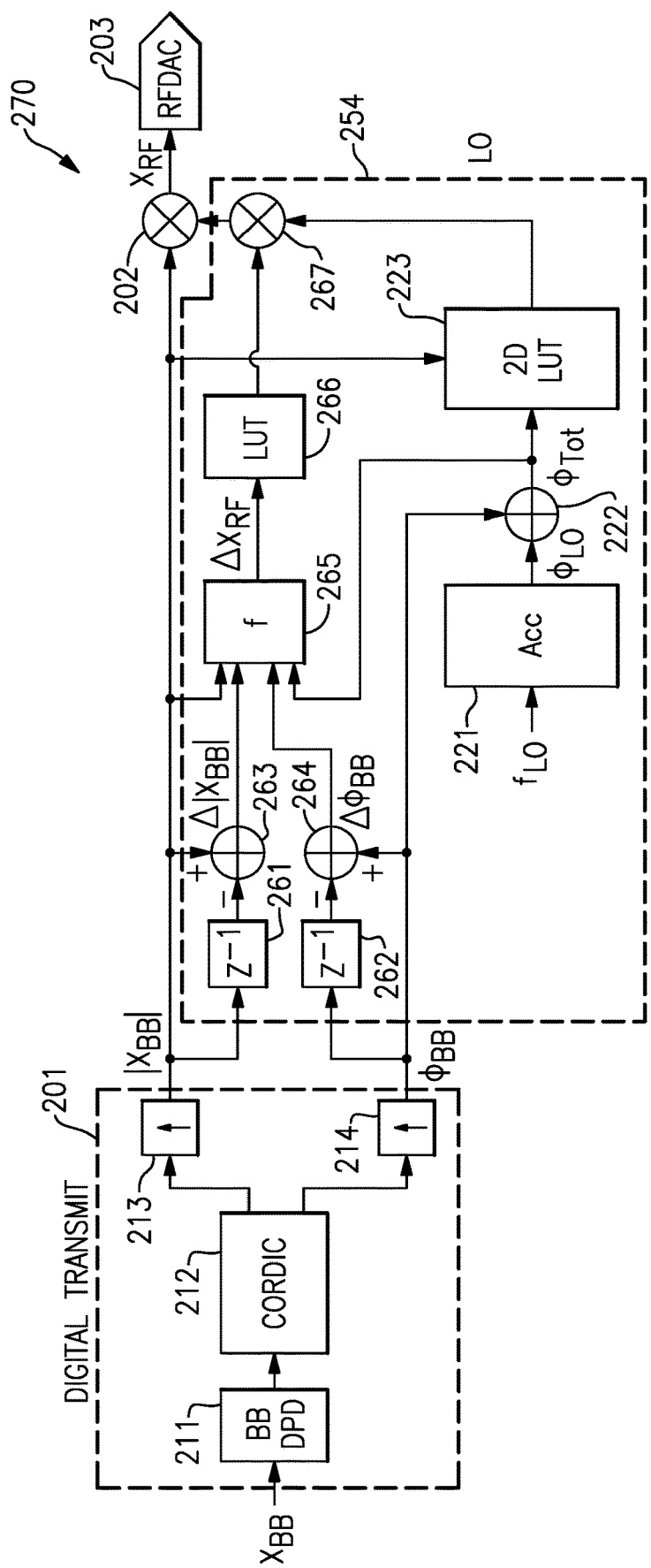
FIG. 6A is a schematic diagram of a transceiver with local oscillator pre-distortion according to another embodiment.

FIG. 6A is a schematic diagram of a transceiver 270 with local oscillator pre-distortion according to another embodiment. The transceiver 270 includes a digital transmit circuit 201, a digital mixer 202, an RF DAC 203, and an LO 254.

The transceiver 270 of FIG. 6A is similar to the transceiver 230 of FIG. 5, except that the LO 254 of FIG. 6A is implemented to provide local oscillator pre-distortion based on detecting a derivative of the RF transmit signal, thereby providing pre-distortion suitable for correcting asymmetric drive of a downstream power amplifier.

For example, the LO 254 of FIG. 6A includes not only an accumulator 221, and adder 222, and a two-dimensional LUT 223, but also a first delay circuit 261 (with z-transform $z^{-1}$), a second delay circuit 262, a first subtractor 263, a second subtractor 264, a derivative computation circuit 265 (providing function f), a signal derivative LUT 266, and a multiplier 267.

In the illustrated embodiment, the first subtractor 263 generates a digital transmit amplitude difference signal $\Delta|X_{BB}|$ based on a difference between the upsampled digital transmit amplitude signal $|X_{BB}|$ and a delayed version of $|X_{BB}|$ provided by the first delay circuit 261. Additionally, the second subtractor 264 generates a digital transmit phase difference signal $\Delta\varphi_{BB}$ based on a difference between the digital transmit phase signal $\varphi_{BB}$ and a delayed version of $\varphi_{BB}$ provided by the second delay circuit 262.

The derivative computation circuit 265 processes $|X_{BB}|$, $\Delta|X_{BB}|$, $\varphi_{Tot}$, and $\Delta\varphi_{BB}$ to estimate a derivative of the digital transmit signal. The estimated derivative serves as an input to the signal derivative LUT 266, which outputs a scaling factor used by the multiplier 267 in scaling the shaped LO clock signal(s) used by the digital mixer 202 for frequency upconversion. Accordingly, in the illustrated embodiment, LO pre-distortion is based not only on the total phase signal $\varphi_{Tot}$ and the digital transmit amplitude signal $|X_{BB}|$, but also on a derivative of the transmit signal.

By implementing the LO pre-distortion in this manner, positive versus negative slope of the transmit signal is detected, thereby allowing asymmetric drive in a downstream power amplifier to be accounted for. For example, implementations of LOs that detect a derivate of a transmit signal allow for providing pre-distortion that accounts for an asymmetry between a drive transistor transfer function of a power amplifier and a matching network transfer function of the power amplifier. For example, typical power amplifier architectures (for example, common source, common emitter, cascode, and/or Doherty) use only one type of transistor to drive the output (for instance. an n-type transistor that only pulls down) instead of a complimentary structure of driving transistors.

Although one embodiment of an LO providing local oscillator pre-distortion based on detecting a derivative of the RF transmit signal is shown, other implementations are possible.

Figure 6B:
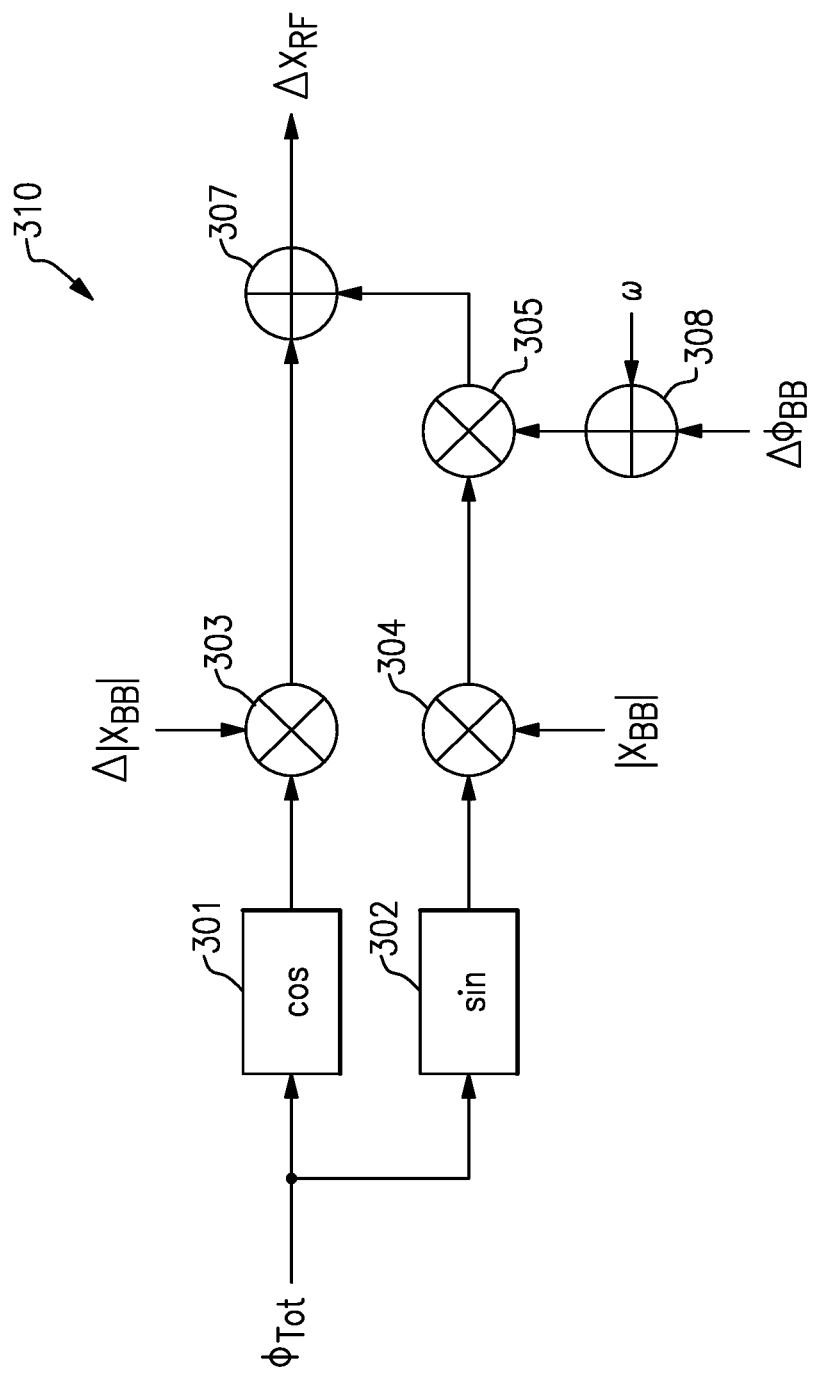
FIG. 6B is a schematic diagram of a derivative computation circuit according to one embodiment.

FIG. 6B is a schematic diagram of a derivative computation circuit 310 according to one embodiment. The derivative computation circuit 310 includes a cosine circuit 301, a sine circuit 302, a first multiplier 303, a second multiplier 304, a third multiplier 305, a first adder 307, and a second adder 308.

Although one embodiment of a derivative computation circuit is shown, other implementations are possible.

In the illustrated embodiment, the cosine circuit 301 and the sine circuit 302 each process $\varphi_{Tot}$. The first multiplier 303 multiples the output of the cosine circuit 301 and $\Delta|X_{BB}|$, while the second multiplier 304 multiplies the output of the sine circuit 302 and $|X_{BB}|$. The second adder 308 adds $\Delta\varphi_{BB}$ and a parameter based on the LO's angular frequency ω. Additionally, the third multiplier 305 multiplies the output of the second multiplier 304 and the output of the second adder 308. Furthermore, the first adder 307 adds the output of the first multiplier 303 and the output of the third multiplier 305 to generate $\Delta X_{RF}$.

Applications

Devices employing the above described schemes can be implemented into various electronic devices. Examples of electronic devices include, but are not limited to, RF communication systems, consumer electronic products, electronic test equipment, communication infrastructure, etc. For instance, tunable filters can be used in a wide range of RF communication systems, including, but not limited to, base stations, mobile devices, instrumentation, industrial electronics, military electronics, laptop computers, tablets, professional wideband digital radios, and compact and/or portable instruments. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radio frequency communication system comprising:
a power amplifier configured to amplify a radio frequency transmit signal; and
a transceiver configured to output the radio frequency transmit signal, wherein the transceiver includes at least one mixer configured to generate the radio frequency transmit signal based on providing frequency upconversion to at least one baseband transmit signal, and a local oscillator configured to pre-distort the radio frequency transmit signal to compensate for a non-linearity of the power amplifier by providing one or more shaped clock signals to the at least one mixer.

2. The radio frequency communication system of claim 1, wherein the local oscillator includes a numerically controlled oscillator (NCO).

3. The radio frequency communication system of claim 1, wherein the one or more shaped clock signals include a shaped sine signal and a shaped cosine signal.

4. The radio frequency communication system of claim 1, wherein the one or more shaped clock signals include a first shaped clock signal generated by a weighted sum of a sine signal and at least one sine harmonic signal, and a second shaped clock signal generated by a weighted sum of a cosine signal and at least one cosine harmonic signal.

5. The radio frequency communication system of claim 1, wherein the local oscillator includes a plurality of coefficients that are adapted to provide pre-distortion based on feedback from an output of the power amplifier.

6. The radio frequency communication system of claim 5, wherein the local oscillator receives an envelope signal indicating an envelope of the radio frequency transmit signal, wherein the coefficients are a function of the envelope signal.

7. The radio frequency communication system of claim 1, wherein the transceiver further includes a digital transmit circuit configured to provide digital pre-distortion to the at least one baseband transmit signal.

8. The radio frequency communication system of claim 7, wherein the digital transmit circuit is configured to provide a digital transmit phase signal to the local oscillator.

9. The radio frequency communication system of claim 8, wherein the local oscillator is configured to generate a total phase signal based on adding the digital transmit phase signal and a local oscillator phase signal.

10. The radio frequency communication system of claim 9, wherein the local oscillator includes an accumulator configured to generate the local oscillator phase signal based on accumulating a frequency control word.

11. The radio frequency communication system of claim 9, wherein the local oscillator includes a look-up table configured to generate the one or more shaped clock signals based on the total phase signal.

12. The radio frequency communication system of claim 11, wherein the digital transmit circuit is further configured to provide a transmit amplitude signal to the local oscillator, wherein the look-up table is indexed by both the total phase signal and the transmit amplitude signal.

13. The radio frequency communication system of claim 1, wherein the local oscillator is configured to pre-distort the radio frequency transmit signal based on detecting a derivative of the at least one baseband transmit signal.

14. The radio frequency communication system of claim 13, wherein the local oscillator is configured to pre-distort the radio frequency transmit signal to account for an asymmetric drive of the power amplifier.

15. A transceiver comprising:
a digital transmit circuit configured to generate at least one baseband transmit signal;
at least one mixer configured to generate a radio frequency transmit signal based on providing frequency upconversion to the at least one baseband transmit signal; and
a local oscillator configured to pre-distort the radio frequency transmit signal by providing one or more shaped clock signals to the at least one mixer.

16. The transceiver of claim 15, wherein the local oscillator includes a plurality of coefficients that are adapted to provide pre-distortion based on feedback from an output of a power amplifier that amplifies the radio frequency transmit signal.

17. The transceiver of claim 16, wherein the local oscillator receives an envelope signal indicating an envelope of the radio frequency transmit signal, wherein the coefficients are a function of the envelope signal.

18. The transceiver of claim 15, wherein the digital transmit circuit is configured to provide a digital transmit phase signal to the local oscillator.

19. The transceiver of claim 18, wherein the local oscillator is configured to generate a total phase signal based on adding the digital transmit phase signal and a local oscillator phase signal.

20. A method of pre-distortion in a transceiver, the method comprising:
   generating at least one baseband transmit signal using a digital transmit circuit;
   generating a radio frequency transmit signal based on mixing the at least one baseband transmit signal using at least one mixer; and
   pre-distorting the radio frequency transmit signal by providing one or more shaped clock signals from a local oscillator to the at least one mixer.

* * * * *